United States Patent [19]

Woods et al.

[11] Patent Number: 5,307,037
[45] Date of Patent: Apr. 26, 1994

[54] SHIM LEAD ASSEMBLY WITH FLEXIBLE CASTELLATED CONNECTOR FOR SUPERCONDUCTING MAGNET

[75] Inventors: Daniel C. Woods; William S. Stogner, both of Florence, S.C.

[73] Assignee: General Electric Company, Milwaukee, Wis.

[21] Appl. No.: 967,315

[22] Filed: Oct. 28, 1992

[51] Int. Cl.⁵ ............................................. H01F 7/22
[52] U.S. Cl. .................................... 335/216; 174/86; 174/15.5
[58] Field of Search .................. 335/216, 296–306; 174/15.4, 15.5, 15.6, 86, 84 R, 151, 65 R, 125.1; 62/51.1, 51.2, 51.3

[56] References Cited

U.S. PATENT DOCUMENTS

| | | | |
|---|---|---|---|
| 3,839,689 | 10/1974 | Biltcliffe et al. | 335/216 |
| 3,948,409 | 4/1976 | Ovchinnikov et al. | 62/514 R |
| 4,447,670 | 5/1984 | Eckels | 174/15 CA |
| 4,633,682 | 1/1987 | Laskaris | 62/514 R |
| 4,813,244 | 3/1989 | Brzozowski | 62/514 R |
| 4,841,268 | 6/1989 | Burnett et al. | 335/216 |
| 4,868,531 | 9/1989 | Yamasaki et al. | 335/216 |
| 4,872,322 | 10/1989 | Woods et al. | 62/51.1 |
| 5,099,215 | 3/1992 | Woods et al. | 335/216 |
| 5,166,776 | 11/1992 | Dederer et al. | 62/51.1 |

Primary Examiner—Leo P. Picard
Assistant Examiner—Raymond Barrera
Attorney, Agent, or Firm—Irving M. Freedman; James O. Skarsten

[57] ABSTRACT

A flexible castellated joint is included in the shim lead assembly electrically connecting the cryostat pressure vessel and the outer vacuum vessel in a superconducting magnet to accommodate relative motion between the two vessels during transportation of the superconducting magnet.

14 Claims, 4 Drawing Sheets

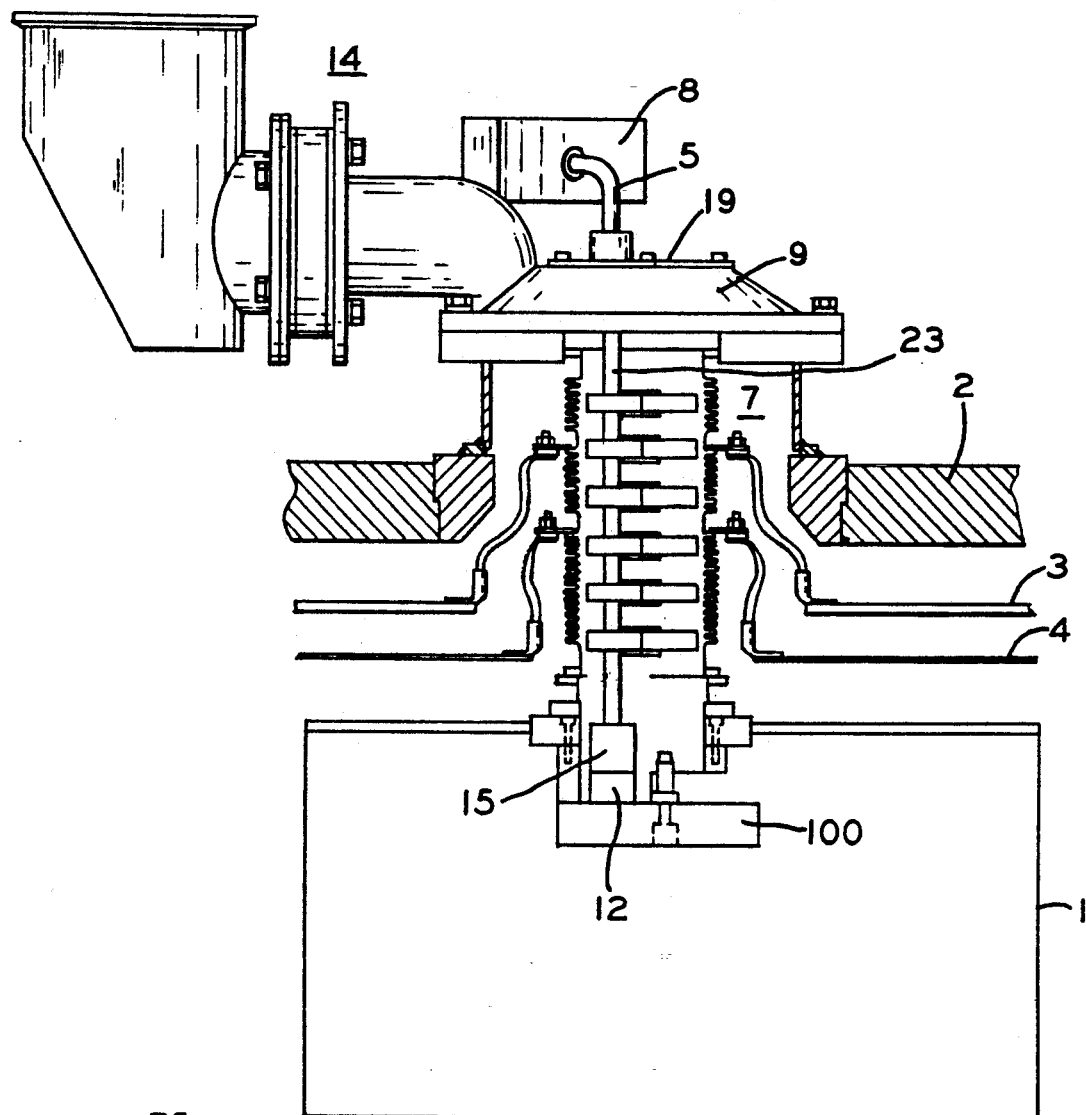
FIG_1
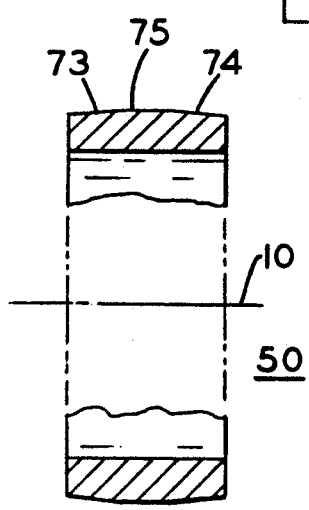
FIG_11

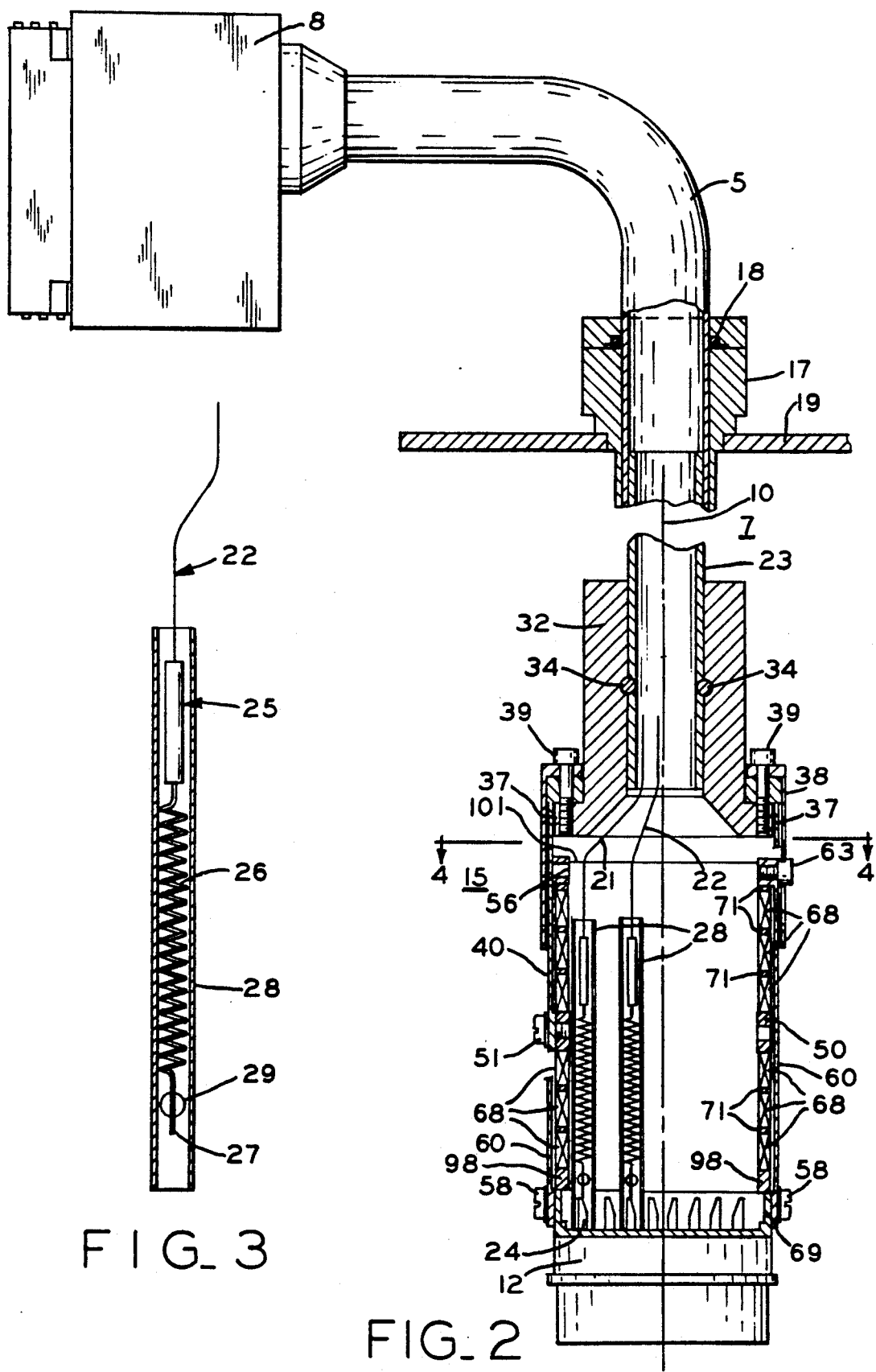

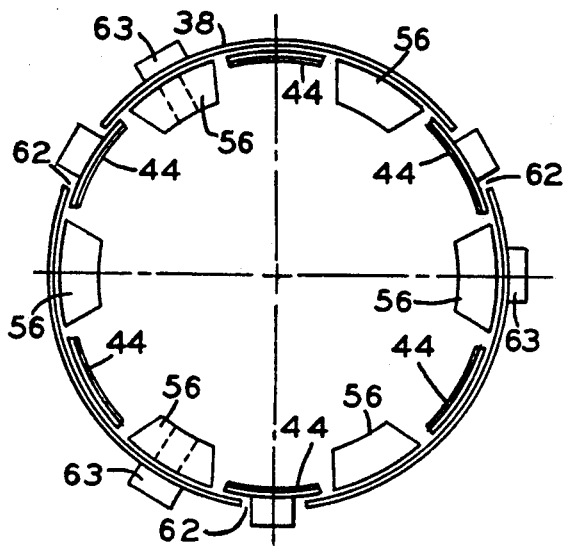
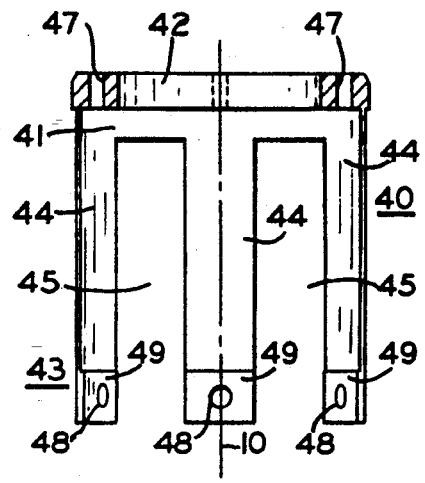
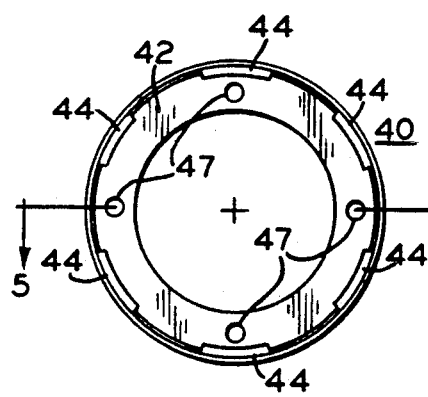
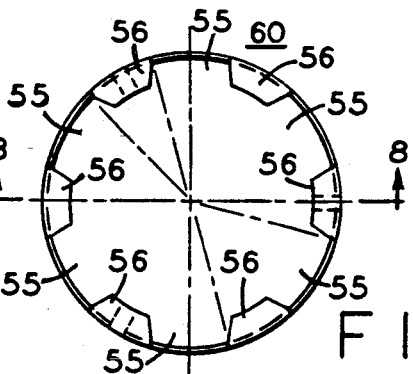
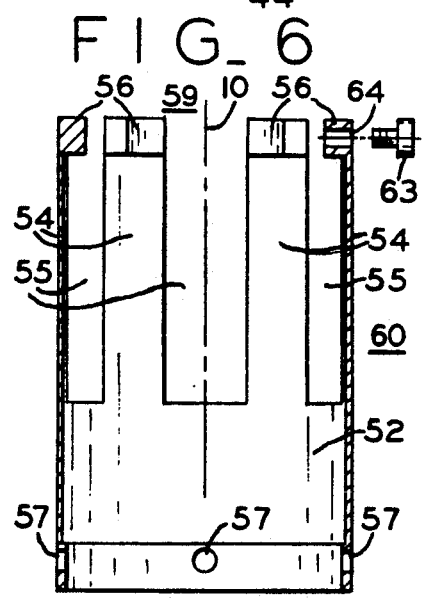
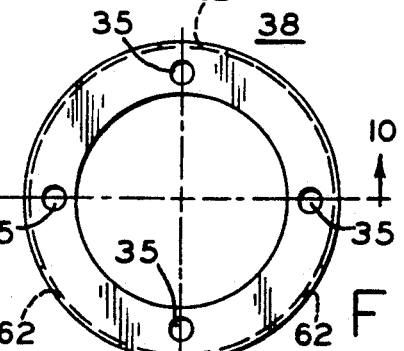
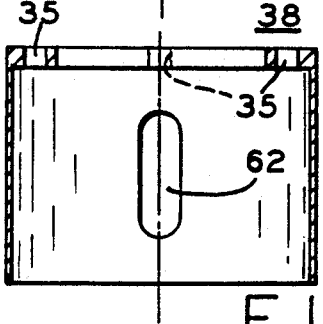

SHIM LEAD ASSEMBLY WITH FLEXIBLE CASTELLATED CONNECTOR FOR SUPERCONDUCTING MAGNET

BACKGROUND OF INVENTION

This invention relates to a shim lead assembly with a flexible connector for use in a superconducting magnet to accommodate movement between the pressurized cryogenic vessel and the outer surrounding vacuum vessel.

As is well known, a magnet can be made superconducting by placing it in an extremely cold environment, such as by enclosing it in a cryostat or pressure vessel containing liquid helium or other cryogen. The extreme cold reduces the resistance in the magnetic coils to negligible levels, such that when a power source is initially connected to the coil (for a period, for example, of ten minutes) to introduce a current flow through the coils, the current will continue to flow through the coils due to the negligible coil resistance, even after power is removed, thereby maintaining a magnetic field. Superconducting magnets find wide application, for example, in the field of magnetic resonance imaging (hereinafter called "MRI").

In such equipment, it is necessary to be able to detachably connect a plurality of electrical connections from a power source outside the vacuum vessel, through the vacuum vessel and through the pressurized helium vessel to the superconducting magnet coils positioned within the pressurized vessel. This is accomplished by a shim lead connector assembly which includes piping or a conduit through which the multiple electrical leads pass with detachable connectors at the ends. The electrical connector on the shim lead assembly mates with a matching connector on the helium vessel magnet connector platform. However, in shipping superconducting magnets to installation sites and in moving superconducting magnets utilized in mobile MRI installations which are repeatedly moved for periodic use at various hospitals or other locations, it has been found that the resulting shocks and vibrations cause small, but potentially damaging, movement or vibrations between the pressure vessel and the outer vacuum vessel, which can damage the superconducting magnet assembly electrical connections. It is particularly important to avoid damage to the helium vessel magnet connector which could result in extended shutdown of the equipment for costly removal and replacement of that connector.

Also, the shim lead 0-ring that seals the magnet penetration well from the atmosphere can be worn by such excessive movement of the shim lead tube caused by movement of the magnet relative to the vacuum vessel. This can result in costly removal and replacement of the shim lead assembly since the shim lead assembly must be disassembled in order to replace the O-ring.

Accordingly, it is highly desirable to be able to accommodate vibration or relative movement between the pressure vessel and the surrounding vacuum vessel in the shim lead connector assembly. However, the resultant assembly must be capable of detachable connection from outside the outer vacuum vessel to the pressure vessel, and must be able to withstand the extremely large thermal, electrical and magnetic forces resulting from operation of the superconducting magnet.

OBJECTS AND SUMMARY OF INVENTION

It is an object of the present invention to provide an improved shim lead assembly to provide electrical connections between the pressure helium vessel of a superconducting magnet and the exterior of the surrounding vacuum vessel.

It is another object of the present invention to provide an improved shim lead assembly for a superconducting magnet which includes a flexible connector to withstand vibration and movement between the pressure vessel and the outer vacuum vessel.

It is yet another object of the present invention to provide an improved shim lead assembly for a superconducting magnet which is suitable for use in mobile MRIs subjected to shock and vibration.

It is still another object of the present invention to provide an improved shim lead assembly for a superconducting magnet which is capable of accommodating movement due to shrinkage of the helium vessel during magnet cool down to superconducting temperatures.

In accordance with one form of the invention, a shim lead assembly electrically connecting between the outside of the vacuum vessel and the pressurized cryogen vessel is provided with a flexible electrical connection through which a plurality of electrical leads pass. The flexible electrical connection includes a flexible joint to accommodate relative movement between the pressure vessel and the outer vessel. A first member is secured to the lead assembly and a second cooperating member is flexibly connected to the first member. Each member includes a cylindrical portion and castellated end regions forming a plurality of axially extending fingers and slots which are interleaved with one another and which are dimensioned and positioned with clearance for limited rotation therebetween, and also for limited axial movement therebetween. Springs positioned between the members provide resiliency to limit the axial movement. The outer diameter of the fingers of the second member is less than the inner diameter of the cylindrical portion of the first member within which it is positioned to enable limited motion in a direction at an angle to the axis of the flexible joint.

Guides for the limited radial and axial motions are provided by axial slots in the cylindrical portion of a fixed member cooperating with pins which extend from the ends of the fingers of the second member. The fingers of the second member pass over a chamfered ring secured to the ends of the fingers of the first member with sufficient clearance to enable the motion around the chamfers at an angle to the axis of the flexible joint. The springs are multiple crest-to-crest spirawave springs which are positioned around the ring-shaped end member between the ends of the fingers of the first member and the ends of the slots of the second member to resist relative motion between the members.

The plurality of electrical leads which pass through the shim lead assembly and terminate at the connector end of the flexible joint each include copper lead wound in a coil adjacent the connector connected to the brass leads which pass through the shim lead assembly with a cylindrical insulating guide around each of the coils, to provide flexibility to the ends of the brass leads.

BRIEF DESCRIPTION OF INVENTION

FIG. 1 is a side view, partially in cross section, showing the present invention in a shim lead assembly.

FIG. 2 is an enlarged side view, partially in cross section, showing details of the shim lead assembly of FIG. 1.

FIG. 3 is an enlarged cross-sectional view of a terminal portion of one of the conductors of FIG. 2.

FIG. 4 is a cross section of FIG. 2 taken along the lines 4—4 of FIG. 2.

FIG. 5 is a cross-section of a first castellated member of FIG. 2 taken along the lines 5—5 of FIG. 6.

FIG. 6 is the bottom view of the first castellated member.

FIG. 7 is a top view of the second castellated member.

FIG. 8 is a cross section of FIG. 7 taken along the lines 8—8 of FIG. 7.

FIG. 9 is a top view of the cap shown in FIG. 2.

FIG. 10 is a cross-section side view of FIG. 9 taken along the lines 10—10 of FIG. 9.

FIG. 11 is an enlarged cross-section of the centering ring shown in FIG. 2 which facilitates angular motion of the second castellated member.

Figure 12:
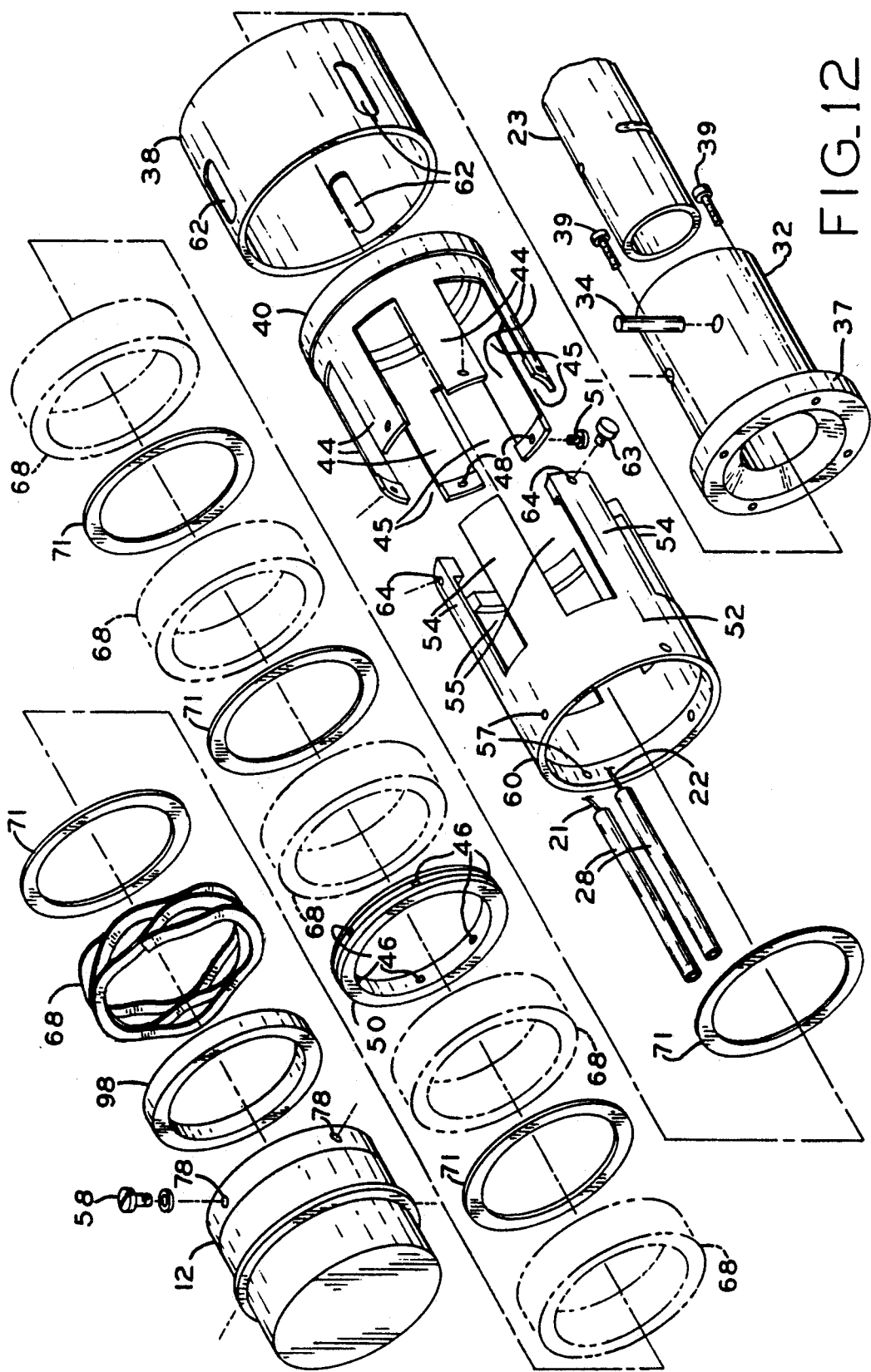
FIG. 12 is an exploded perspective view of various components shown in the bottom portion of FIG. 2 and useful in showing the interrelationship of the various components.

Referring first to FIG. 1, cryogen pressure vessel 1, which includes the liquid helium and superconducting magnet coils, is contained within outer vacuum vessel 2, only a portion of the upper wall being shown. A plurality of thermal shields 3 and 4, cylindrical in cross section and spaced from pressure vessel 1, are interposed between the pressure vessel and outer vessel 2. Shim lead assembly indicated generally as 7 includes connector box 8 outside outer vessel 2 and extends through access port 9 to connect with multi-conductor connector 12 on the helium vessel magnet connector platform 100 for electrical connection to the magnet coils within the superconducting magnet assembly. Exhaust assembly 14 provides a path for helium boil-off to be vented to the atmosphere.

In transporting superconducting magnets, either to installation sites, or for use in a mobile MRI installation repeatedly moved to selected locations for temporary use at those locations, relative movement between pressure vessel 1 and outer vessel 2 can provide sufficient vibration and shock to fatigue and/or damage shock absorbing materials such as O-rings, multi-conductor connector 12, and/or the conductors such as 21 and 22 (see FIG. 2) within shim lead assembly 7. This can cause failure of the MRI equipment and costly down-time and repair or replacement of parts, particularly if multiconductor connector 12 has to be replaced.

In accordance with the present invention, floating end connector 15 is provided to accommodate motion of pressure vessel 1 and connector 12 relative to outer vessel 2 by shim lead assembly 7 attached between the pressure and outer vessels.

The details of floating end connector 15 are shown in FIGS. 2–12. Referring next to FIGS. 2 and 12, the outer vessel 2 end of shim lead assembly 7 includes bushing 17 and internal O-ring 18 through which the shim lead assembly passes through cover 19 of access port 9. A plurality of conductors such as 21 and 22 pass through stainless steel elbow 5 and through conduit 23 to floating end connector 15. In a typical MRI, there are in the order of 36 conductors, with only 2, 21 and 22 being shown by way of example. O-ring 18 surrounds elbow 5 in bushing 17, and is subject to failure due to movement and vibration between pressure vessel 1 and outer vacuum vessel 2 in the absence of the present invention.

FIG. 3 is an enlarged view showing the termination of conductors such as 21 and 22. Referring to FIG. 3, conductor 22 is brass, utilized because of its suitability at cryogenic temperatures. In order to provide flexibility of the conductors within floating end connector 15, brass conductor 22 is connected at solder joint 25 to coil 26 wound of copper wire with its end 27 terminating at female terminal 24 of multi-conductor connector 12 (also see FIG. 2). Surrounding each solder joint 25 and coil 26 is TEFLON tube 28, which includes one or more apertures 29 at its end region adjacent terminal 24 to allow helium boil-off to pass through the TEFLON tube for cooling purposes.

Referring again to FIGS. 2 and 12, fiberglass laminate adaptor 32 is secured to conduit 23 by dowels 34 which pass through mating arcuate portions of adaptor 32 and conduit 23. Adaptor 32 terminates in shoulder 37 to which cylindrical guide cap 38 is secured by a plurality of screws 39. Positioned within cap 38 is a first stainless steel castellated member 40, details of which are shown in FIGS. 5 and 6.

Referring also to FIGS. 5 and 6,, stationary first castellated member 40 includes upper cylindrical portion 41, ring-shaped cap 42 and castellated portion or region 43 including six depending fingers 44 with slots 45 between the depending fingers. Fingers 44 are angularly spaced about axis 10 of floating end connector 15. Holes 47 are provided for screws 39 (also see FIGS. 2 and 12) which pass through to secure cylindrical cap 38 and castellated stationary member 40 to shoulder 37 of adaptor 32. Bores 48 at the open ends of fingers 44 within the thicker portion of fingers 44 provide apertures through which screws 51 pass to secure castellated stationary member 40 to threaded bores 46 (see FIG. 12) in chamfered ring 50. Ring 50 is secured within fingers 44 by screws 51 passing through holes 48 in fingers 44, and includes chamfered circumferential portions, chamfered at an angle to axis 10 of floating end connector 15 as shown in FIG. 11. Referring to FIG. 11, the cross-section of chamfered ring 50 (shown exaggerated) includes outer circumferential surfaces 73 and 74 at an angle to axis 10 of floating end connector 15. Surfaces 73 and 74 are chamfered at an angle of approximately 1.5 degrees to axis 10 to enable limited angular movement of floating end connector 15 about central apex 75 as described below.

Moveable second castellated member 60 (see FIGS. 7 and 8), includes lower cylindrical portion 52, and castellated end portion 59 with upwardly extending fingers 54 which form slots 55 therebetween. There are six fingers 54 and six gaps 55 angularly spaced about axis 10 of floating end connector 15 which are dimensioned such that the fingers 55 of moveable castellated member 60 can fit within, and move within, slots 45 of stationary castellated member 40. That is, fingers 54 extend over a circumferential distance less than slots 45 of stationary castellated member 40, while fingers 44 of the stationary castellated member extend over a circumferential distance less than slots 55 of moveable castellated member 60, enabling rotation of the moveable castellated member within the confines of slots 45 of the stationary castellated member when the fingers and slots are interleaved and positioned as shown in FIG. 2. Moveable castellated member 60 includes four apertures 57 (see FIG. 8) spaced about the surface of cylindrical portion 52 remote from fingers 54 through which screws such as 58 (see FIGS. 2 and 12) pass to secure moveable castellated member 60 to multi-conductor connector 12.

Referring next to FIGS. 4, 9, 10, and 12, cylindrical guide cap 38 includes three axially extending slots 62 positioned around the circumference of the cylindrical cap which cooperate with set screws such as 63 threaded into tapped holes 64 in alternate ends of fingers 54 of moveable castellated member 60 to guide and limit the movement of the moveable castellated member. Set screws such as 63 are threaded into tapped hole 64 after assembly of moveable castellated member 60 within cylindrical cap 4 with fingers 44 and 54 of stationary castellated member 40 and moveable castellated member 60 interleaved and positioned within slots 55 and 45, respectively, of the castellated members. The movement of set screw 63 within slotted guides 62 directs and limits the motion of fingers 54 of moveable castellated member 60 in both the radial and axial direction. Movement or rotation in a radial direction of moveable castellated member 60 is also limited by the clearance between fingers 54 of the moveable castellated member and the width of slots 45 in the stationary castellated member.

Angular motion of moveable castellated member 60 about ring 50 is possible because of the clearance between the outside diameter of fingers 54 of the moveable castellated member and the inner diameter of cylindrical cap 38. This angular motion is facilitated by the slightly angularly cut, or beveled, surfaces (see FIG. 11) of chamfered centering ring 50 which underlies fingers 54 of moveable castellated member 60. The angular motion of moveable castellated member 60 within cylindrical cap 38 is limited by the amount of clearance therebetween, with further movement being prevented by contact of fingers 44 with the inside of the lower portion of cylindrical cap 38.

Floating end connector 15 includes a plurality of flat compression springs 68 positioned on either side of ring 50 as best shown in FIGS. 2 and 12. Suitable springs are the flat wire compression springs sold by Smalley Steel Ring Company of Wheeling, Illinois under their trademark CREST-TO-CREST SPIRAWAVE. Referring again to FIGS. 2 and 12, it is to be noted that three flat compression springs 68 are positioned above chamfered centering-ring 50, while three are positioned below ring 50, providing a centering, or restoring, force around ring 50. Groups of three flat compression springs 68 provide a spring rate of 24 pounds per inch. This spring rate arrived at empirically is less than the mechanical force required to move shim lead tube 102 relative to O-ring 18 (see FIG. 1). This prevents wear of O-ring 18 which is costly to repair since the entire shim assembly 7 must be replaced to replace the O-ring. A MYLAR sheet formed into a tube may be inserted around springs 68, centering ring 50 and annular washers 71 to surround tubes 28 and provide an insulating shield which prevents the movement of the springs and washers from causing any mechanical wear of the insulating TEFLON tubes 28. Flat compression springs 68 are fabricated of 17-7 stainless steel, while cylindrical cap 38, stationary castellated member 40, ring 50, and moveable castellated member 60 are also fabricated of stainless steel.

Annular ring spacer 98 is positioned between bottom flat compression springs 68 and rim 69 of multi-conductor connector 12. Annular washers such as 71 (see FIG. 12) are positioned between adjacent flat compression springs 68.

In assembling floating end connector 15, ends 27 of copper coil springs of conductors such as 21 and 22 are soldered to terminals 24 of connector 12. Brass conductors 22 extending through conduit 23 and floating end conductor 15 are then soldered to the appropriate coil springs 26 and TEFLON tubes 28 which have previously been placed around brass conductors 22 are slid over solder joints 25 and copper coil springs 26.

Cylindrical guide cap 38 and stationary castellated member 40 are then slid over the assembled parts above adapter 32.

Three springs 68 separated by two washers 71 and with chamfered ring 50 are then positioned around moveable castellated member 60 with the chamfered ring closest to the castellated region of the moveable member. The remaining three springs 68 are separated by the remaining two washers with spacer 98 are then positioned around moveable member 60 to form a subassembly. The subassembly is then slid into position with stationing castellated member 40 with fingers 50 of moveable member 60 interleaved within slots 45 of the stationary castellated member until the end spring 68 contacts shoulder 37 of adaptor 32.

Screws 51 are then passed through apertures 48 in fingers 44 of stationary castellated member 40 into threaded apertures 46 of chamfered containing ring 50. Cylindrical cap 38 is then slid over cylindrical portion 31 of stationary castellated member 40 and secured to shoulder 37 of adaptor 32 by screws 39.

Connector assembly 12 is then slid into cylindrical portion 52 of moveable castellated member 60 and the leads such as 21 and 22 are slid through the interior bore of conduit 23, through steel elbow 5 and into connector box 8 (see FIG. 1) to terminate in an appropriate connector.

Screws 58 may then be inserted through apertures 57 of moveable castellated member 60 into threaded apertures 78 in multi-conductor connector 12 to secure the multi-conductor connector to the moveable castellated member.

Floating end connector 15 thus provides guided and constrained movement of moveable castellated member 60 in the axial direction, in the radial direction, and in the angular direction relative to axis 10. The assembly is rugged, able to withstand shock and vibration resulting from movement of cryogen pressure vessel 1 relative to outer vacuum vessel 2 during transportation of the superconducting magnet to a facility for installation, or during repeated movement within a mobile truck-equipped MRI. The assembly can further withstand the thermal, electromagnetic, and mechanical forces encountered during cool-down of the superconducting magnet to superconducting temperatures and during operation.

While the present invention has been described with respect to certain preferred embodiments thereof, it is to be understood that numerous variations in details of construction, the arrangement and combination of parts, and the type of materials used may be made without departing from the spirit and scope of the invention.

What we claim is:

1. In a superconducting magnet assembly including a cryogen pressure vessel surrounded by an outer vessel and subjected to vibration, a flexible electrical connection between the pressure vessel and the outer vessel comprising:

a plurality of electrical leads connected from the outside of said outer vessel remote from said pressure vessel and passing through a lead assembly to a connector adapted to be connected to said pressure vessel;

a flexible joint in said lead assembly to accommodate relative movement between said pressure vessel and said outer vessel;

said flexible joint including a first castellated member secured to said lead assembly, and a second castellated member connected to said connector;

said first castellated member including a first cylindrical portion and a first castellated end region forming a plurality of first end fingers and first slots extending axially toward said second castellated member;

said second castellated member including a second cylindrical portion remote from said first castellated member and a second castellated end portion forming a plurality of second end fingers and second slots extending axially toward said first castellated member;

said first fingers and said first slots being dimensioned and positioned to interleave with said second fingers and said second slots with clearance for limited rotation therebetween and for limited axial motion therebetween;

a spring providing resiliency against said limited axial movement; and means to allow limited motion in a direction at an angle to the axis of said flexible joint;

whereby said flexible joint is moveable in response to relative motion between said pressure vessel and said outer vessel.

2. The superconducting magnet flexible electrical connection of claim 1 wherein said limited motion at an angle to said axis is provided by the clearance between the circumference of the fingers of one of said first and second castellated members within a cylinder overlying the fingers.

3. The superconducting magnet flexible electrical connection of claim 2 wherein axial guide slots within said cylinder cooperate with protrusions on the fingers of said one of said first and second castellated members to provide guiding means for the relative movement between said first and second castellated members, and wherein the axial length and circumferential width of said axial guide slots are greater than that of said protrusions to enable limited motion between said first and second castellated members.

4. The superconducting magnet flexible electrical connection of claim 3 wherein the end fingers of said second castellated member are movable within said cylinder.

5. The superconducting magnet flexible electrical connection of claim 4 wherein said protrusions are on said end fingers of said second castellated member.

6. The superconducting magnet flexible electrical connection of claim 5 wherein the ends of said fingers of said first castellated member are secured to a ring-shaped member chamfered at angles to the axis of said flexible joint.

7. The superconducting magnet flexible electrical connection of claim 6 wherein said fingers of said second castellated member extend over said ring-shaped member with the external diameter of said fingers of said second castellated member being less than the internal diameter of said cylinder enabling said fingers of said second castellated member to move over said ring-shaped member in both the axial and radial directions of said flexible joint, and also to pivot about said ring-shaped member for said movement at an angle to the axis of said flexible joint.

8. The superconducting magnet flexible electrical connection of claim 7 wherein said spring includes multiple substantially ring-shaped crest to crest spirawave springs.

9. The superconducting magnet flexible electrical connection of claim 8 wherein said spirawave springs are positioned on either side of said ring-shaped member and within said fingers of said first and second members.

10. The superconducting magnet flexible electrical connection of claim 9 wherein said connector is a multi-conductor connector configured to mate with a second connector secured to said pressure vessel.

11. The superconducting magnet flexible electrical connection of claim 10 wherein said plurality of electrical leads include flexible portions connected to said multi-conductor connector.

12. The superconducting magnet flexible electrical connection of claim 11 wherein said flexible portions include a circuitous path for said electrical leads to accommodate the flexing of said flexible joint.

13. The superconducting magnet flexible electrical connection of claim 12 wherein said electrical leads are brass leads connected to copper leads in said flexible portions.

14. The superconducting magnet flexible electrical connection of claim 13 wherein said circuitous path is in the form of a coil, and an insulating cylindrical guard is provided around said coil.

* * * * *